United States Patent [19]
Iwasaki

[11] Patent Number: 5,907,772
[45] Date of Patent: May 25, 1999

[54] METHOD OF PRODUCING CYLINDRICAL STORAGE NODE OF STACKED CAPACITOR IN MEMORY CELL

[75] Inventor: Haruo Iwasaki, Tokyo, Japan

[73] Assignee: NEC Corporation, Tokyo, Japan

[21] Appl. No.: 08/806,420

[22] Filed: Feb. 26, 1997

[30] Foreign Application Priority Data

Feb. 26, 1996 [JP] Japan .................................. 8-063674

[51] Int. Cl.⁶ .............................................. H01L 21/8242
[52] U.S. Cl. .......................................... 438/253; 438/396
[58] Field of Search ................................... 438/253, 254, 438/396, 393, 397, 240, FOR 220, FOR 430, FOR 212, 637, 702; 148/DIG. 14, DIG. 50, DIG. 133

[56] References Cited

U.S. PATENT DOCUMENTS

| 5,137,842 | 8/1992 | Chan et al. | 438/240 |
| 5,550,076 | 8/1996 | Chen | 438/253 |
| 5,643,819 | 7/1997 | Tseng | 438/253 |
| 5,677,221 | 10/1997 | Tseng | 438/396 |
| 5,681,773 | 10/1997 | Tseng | 438/396 |
| 5,721,168 | 2/1998 | Wu | 438/253 |
| 5,726,086 | 3/1998 | Wu | 438/253 |

FOREIGN PATENT DOCUMENTS

| 2-260454 | 10/1990 | Japan . |
| A4 755 | 1/1992 | Japan . |
| A6151748 | 5/1994 | Japan . |
| A7 29994 | 1/1995 | Japan . |
| A7 78946 | 3/1995 | Japan . |

OTHER PUBLICATIONS

W. Wakamiya et al., "Novel Stacked Capacitor Cell for 64Mb DRAM", *1989 VLSI Symposium*, pp. 69–70.

*Primary Examiner*—John F. Niebling
*Assistant Examiner*—S. Mulpuri
*Attorney, Agent, or Firm*—Sughrue, Mion, Zinn Macpeak & Seas, PLLC

[57] ABSTRACT

The invention relates to the fabrication of a cylindrical storage node in a stacked capacitor cell of DRAM. As is usual, a MOS transistor is fabricated in a silicon substrate, and interlayer insulator and interconnection are formed on the substrate. As an upper interlayer insulator film which serves as an etch stop film, a silicon nitride or silicon oxide film is formed, and this film is overlaid with a planarizing film such as a BPSG film. Then, a contact hole is formed and filled with a conductor to provide a storage node contact. After that the planarizing film is removed, and a cylindrical storage node is formed on the exposed etch stop film. The cylindrical part of the storage node is formed by patterning a relatively thick BPSG film so as to provide a cylindrical wall face, forming a polysilicon sidewall on the cylindrical wall face and then completely removing the BPSG film. At this stage the etch stop film retains sufficient thickness since this film was protected by the planarizing film at the stage of forming the storage node contact. So, no defects such as cavities develop in interlayer insulators. By this method the total thickness of interlayer insulators can be reduced, so that the storage node contact can be formed accurately and reliably.

11 Claims, 11 Drawing Sheets

METHOD OF PRODUCING CYLINDRICAL STORAGE NODE OF STACKED CAPACITOR IN MEMORY CELL

BACKGROUND OF THE INVENTION

This invention relates to the fabrication of a DRAM cell consisting of a MOS transistor and a capacitor which is stacked over the transistor, and more particularly to a method of producing a cylindrical storage node of the stacked capacitor.

In MOS DRAMs, since the introduction of the 1k DRAM in the early 1970s the memory density has been multiplied by 4 every 3 years with a reduction in memory cell area to 30–40%. Although the memory cell area is reduced, it is necessary to retain a sufficiently large storage capacitance in order to keep immunity to soft errors. In this regard, it is advantageous to employ stacked capacitor cells.

For further enhancement of the density of DRAM cells with furhter reduction in memory cell area, a stacked capacitor cell having a cylindrical capacitor is under development. The storage node of the cylindrical capacitor has a hollow cylinder of polysilicon (polycrystalline silicon) which stands vertically, and both the outer and inner surfaces of the cylinder are used as a capacitance area. With this structure the storage capacitance can be increased without enlarging the memory cell area.

For example, JP-A 2-260454 (1990) shows a method of producing the above-mentioned cylindrical capacitor.

In the accompanying drawings, FIG. 4 shows the structure of a memory cell produced by using a method according to JP-A 2-260454. On a p-type silicon substrate 60, a field oxide film 62 defines an active area. The memory cell has a MOS transistor 64 with a gate oxide film 66 and $n^+$-type source and drain regions 70, 72 in the substrate 60 and a gate electrode 68 on the substrate. Dielectric films 74 and 76 constitute an interlayer insulator. Bit line interconnection 82 on the interlayer insulator is connected to the source/drain region 70 of the transistor by a contact 80 provided by using a contact hole 78 in the insulator. The interconnection 82 is covered by a silicon oxide film 84, which is overlaid with a planarizing film 86 of borophosphosilicate glass (BPSG), viz. silicon oxide doped with boron and phosphorus. On the planarizing film 86 there is another silicon oxide film 88 which is used as an etch stop film. The films 84, 86 and 88 constitute a second interlayer insulator. A cylindrical capacitor 94 stands on the silicon oxide film 88. The capacitor consists of a cylindrical storage node (viz. a lower plate) 96 having a closed bottom, a dielectric film 98 which covers the outer and inner surfaces of the storage node 96 and a conductor film (upper plate) 100 deposited on the dielectric film 98. The bottom of the storage node 96 is connected to one of the source/drain regions 70, 72 of the transistor by a contact 92 which is provided by using a contact hole 90 in the interlayer insulators.

FIGS. 5(A) to 5(F) illustrate a known process of forming the cylindrical storage node 96 in FIG. 4.

Referring to FIG. 5(A), the surface of the BPSG film 86 is planarized by a reflow treatment, and the silicon oxide film 88 is deposited to a thickness sufficient for an etch stop film. Then the contact hole 90 for the storage node is formed by photolithography and etching.

Referring to FIG. 5(B), a conductor film (not shown) is deposited on the etch stop film 88 until the contact hole 90 is filled with the deposited conductor 92, and then the conductor film is removed by an etch-back treatment so as to leave the conductor 92 only in the contact hole 90. It is inevitable that the etch stop film 88 also undergoes etching and consequently) considerably reduces thickness.

Referring to FIG. 5(C), a polysilicon film 96A is deposited on the etch stop film 88, and a relatively thick BPSG film 102 is deposited on the polysilicon film 96A. Then, the BPSG film 102 and the underlying polysilicon film 96A are patterned into the shape of a solid cylinder by photolithography and etching. The BPSG film 102 in the cylindrical shape becomes a temporary core of the aimed cylindrical storage node.

Referring to FIG. 5(D), a polysilicon film 96B is deposited on the etch stop film 88 so as to entirely cover the BPSG core 102 and the underlying polysilicon film 96A.

Referring to FIG. 5(E), the polysilicon film 96B is subjected to etch-back by anisotropic etching so as to leave the film 96B only as a cylindrical sidewall on the side face of the BPSG core 102 and the underlying polysilicon film 96A. After that, as shown in FIG. 5(F), the BPSG core 102 is completely removed by selective etching with high selectivity to the BPSG core 102 relative to the etch stop film 88. The polysilicon film 96A lying on the etch stop film 88 and the cylindrical sidewall part of the polysilicon film 96B constitute the cylindrical storage node 96 shown in FIG. 4.

In the above process, the etch stop film 88 is repeatedly exposed to etching solutions or gases. Therefore, it is likely that the etch stop film 88 in FIG. 5(F) is unduly thin or has openings. Then, the etching solution penetrates into the BPSG film 86 and locally dissolves the film 86 to form some cavities 106. When cavities exist in the BPSG film 86, subsequent heat treatments will induce unexpected stress in the film 86, and the dielectric film of the capacitor may be damaged by the influence of the stress.

If the initial thickness of the etch stop film 88 is greatly increased to compensate for the inevitable loss of film thickness, it becomes difficult to form the contact hole 90 because etching is liable to terminate before reaching the substrate surface. Incompleteness of the contact hole 90 is a cause of an open contact defect of the storage capacitor and a resultant bit error.

When the etch stop film 88 is very thick, it is conceivable to omit the planarizing BPSG film 86 to avoid undesriable increase in the total thickness of interlayer insulators. However, in that case the etch stop film 88 has a stepped profile reflecting steps on the underlying layer. So, in the photolithography for forming the contact hole 90 a resist pattern is formed on an unplanarized surface, and therefore there is a possibility of inaccurate opening of the contact hole 90. For this reason, the storage node contact is likely to be defective.

SUMMARY OF THE INVENTION

It is an object of the present invention to provide an improved method for producing a cylindrical storage node of a stacked capacitor in a MOS memory cell in order to surely provide a good storage node contact and to surely prevent interlayer insulators under the capacitor from being damaged by etching agents without unduly increasing the total thickness of interlayer insulators.

A method according to the invention comprises the following sequential steps: (a) forming a first dielectric film, which serves as an etch stop film, on an interlayer insulator laid over a semiconductor substrate in which a MOS transistor is already fabricated; (b) forming a second dielectric film, which serves as a planarizing film, on the first dielectric film and planarizing the surface of the second dielectric film; (c) forming a contact hole, which reaches a source/drain region of the MOS transistor, through the first and second dielectric films and the underlying interlayer insulator and filling the contact hole with a conductor to provide a storage node contact; (d) after step (c), removing the second dielectric film by etching to expose the first dielectric film; (e) depositing a first conductor film on the first dielectric film, the first conductor film being in contact with the storage node contact; (f) depositing a relatively thick third dielectric film over the first conductor film and patterning the third dielectric film so as to provide a cylindrical wall face on the first conductor film; (g) forming a second conductor film as a cylindrical sidewall on the cylindrical wall face of the third dielectric film; and (h) completely removing the third dielectric film by etching.

In this method, the first dielectric film is usually a silicon nitride film or a silicon oxide film. This film serves as an interlayer insulator film and, furthermore, serves as an etch stop film in forming the cylindrical storage node by the above-stated steps (f) to (h). Usually, the second dielectric film (planarizing film) is a BPSG films and the third dielectric film used to form the cylindrical part of the storage node is also a BPSG film. The first and second conductor films to form the storage node are usually polysilicon films.

In this invention the etch stop film is protected by the planarizing film at the stage of providing the storage contact by forming a contact hole and filling the contact hole with a conductor. Therefore, the etch stop film does not reduce its thickness before the stage of forming the cylindrical storage node on this film. So, in the etching processes to form the storage node the etching agents do not penetrate into interlayer insulators, and hence no defects such as cavities develop in interlayer insulators.

In this invention the etch stop film does not need to be made unduly thick. So, the total thickness of interlayer insulators can be reduced, and accordingly the contact hole for the storage node can be formed accurately and reliably.

For these reasons, by using this invention the yield of memory chips can be improved.

DESCRIPTION OF THE PREFERRED EMBODIMENTS

Figure 1:
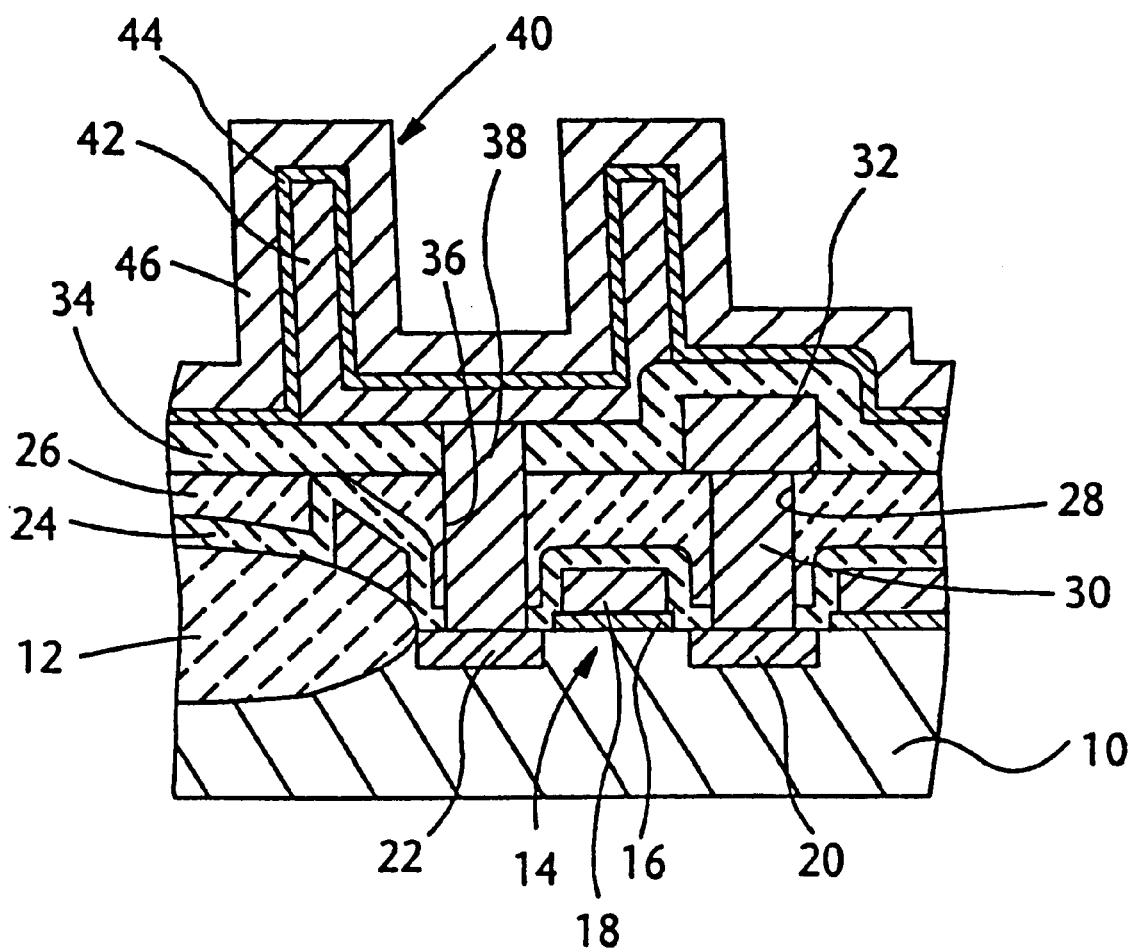
FIG. 1 is a schematic cross-sectional view of a memory cell having a cylindrical stacked capacitor produced by using a method according to the invention.

As an embodiment of the inventions a method according to the invention is used to produce a DRAM cell of a stacked capacitor type shown in FIG. 1. The memory cell has a MOS transistor 14, which is fabricated in a p-type silicon substrate 10 in an active area defined by a field oxide film 12, and a capacitor 40 which is stacked over the transistor 14 above the surface of the substrate 10. The capacitor 40 has a cylindrical shape with a closed bottom and an open top.

The MOS transistor 14 has a gate oxide film 16, a gate electrode 18 and $n^+$-type source and drain regions 20 and 22. After fabricating the transistor 14, a silicon oxide film 24 is deposited over the whole area of the substrate 10 including the field oxide film 12 and the gate electrode 18. The oxide film 24 is overlaid with a BPSG film 26, or a phosphosilicate glass (PSG) film, which is planarized by a reflow treatment. The oxide film 24 and the BPSG film 26 constitute an interlayer insulator. On the BPSG film 26 there is a bit line interconnection 32 of a metal or a metal silicide, which is connected to the source/drain region 20 of the transistor 14 by a contact 30 provided by using a contact hole 28 through the BPSG film 26 and the oxide film 24.

An insulating film 34 covers the BPSG film 26 and the interconnection 32. Usually the insulating film 34 is a silicon nitride film or a silicon oxide film. This insulating film 34 serves as an etch stop film as will be described hereinafter. Above the source/drain region 22 of the transistor 14 a contact hole 36 is formed through the insulating films 34, 26, 24, and the contact hole 36 is filled with a metal plug 38 to provide a storage node contact.

The cylindrical capacitor 40 stands on the insulating film 34. The capacitor 40 consists of a cylindrical storage node (viz., a lower plate) 42 having a bottom part in contact with the contact 38, a dielectric film 44 which covers the outer and inner surfaces of the cylindrical storage node 42 and an upper plate 46 which is a conductor film deposited on the dielectric film 44.

FIGS. 2(A) to 2(I) illustrate a process of forming the cylindrical storage node 42 in FIG. 1.

Figure 2A:
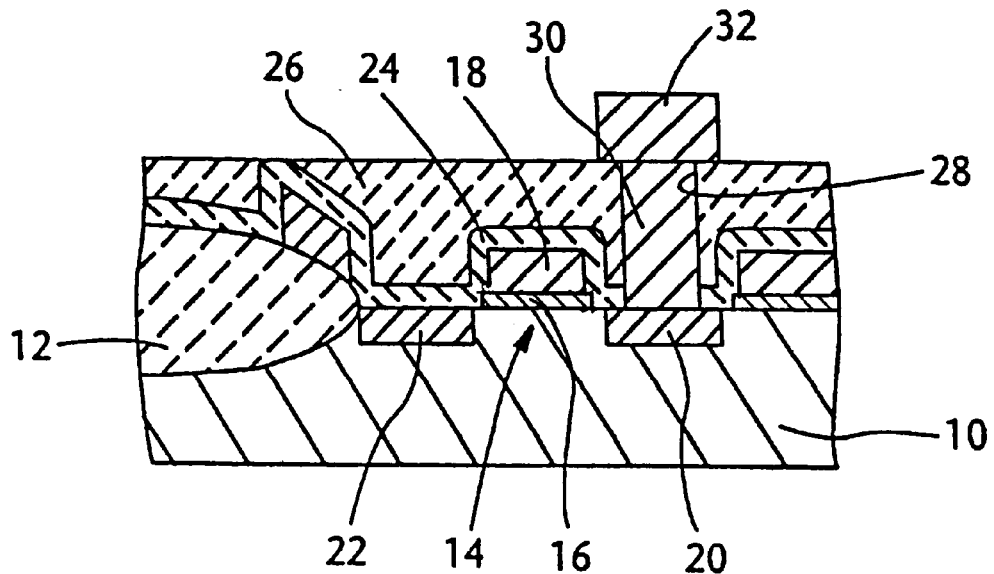
FIGS. 2(A) to 2(I) illustrate, in schematic cross-sectional views, a process of forming a cylindrical storage node in the memory cell of FIG. 1 as an embodiment of the invention.

Referring to FIG. 2(A), the MOS transistor 14 is already fabricated, and the insulating films 24 and 26, the contact 30 and the interconnection 32 are successively formed by conventional procedures.

Figure 2B:
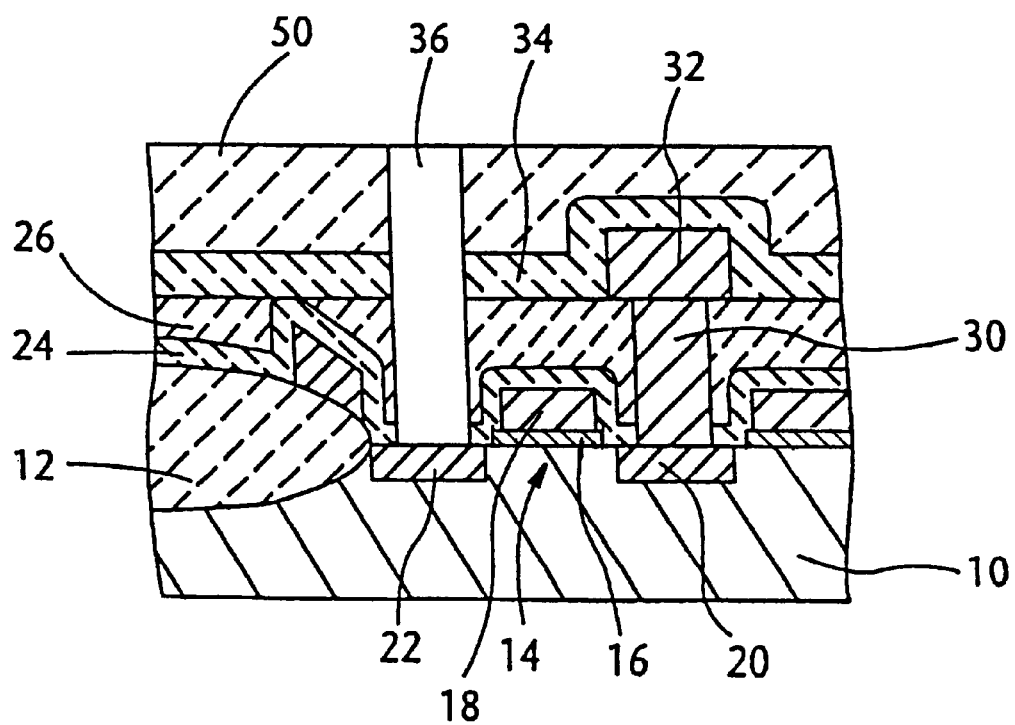

Referring to FIG. 2(B), silicon nitride or silicon oxide is deposited on the BPSG film 26 of the interlayer insulator to form an insulating film 34 which covers the interconnection 32. Next, as a planarizing film, a BPSG film 50 is deposited on the film 34, and the surface of the BPSG film 50 is planarized by a reflow treatment. Then, a contact hole 36 for the capacitor is formed through the insulating films 50, 34, 26 and 24 in the area above the source/drain region 22 of the transistor 14. The contact hole 36 is formed by photolithography and subsequent etching. In the photolithography, the resist pattern for the contact hole 36 is good in accuracy since the resist pattern is formed on the planarized surface of the film 50.

Figure 2C:
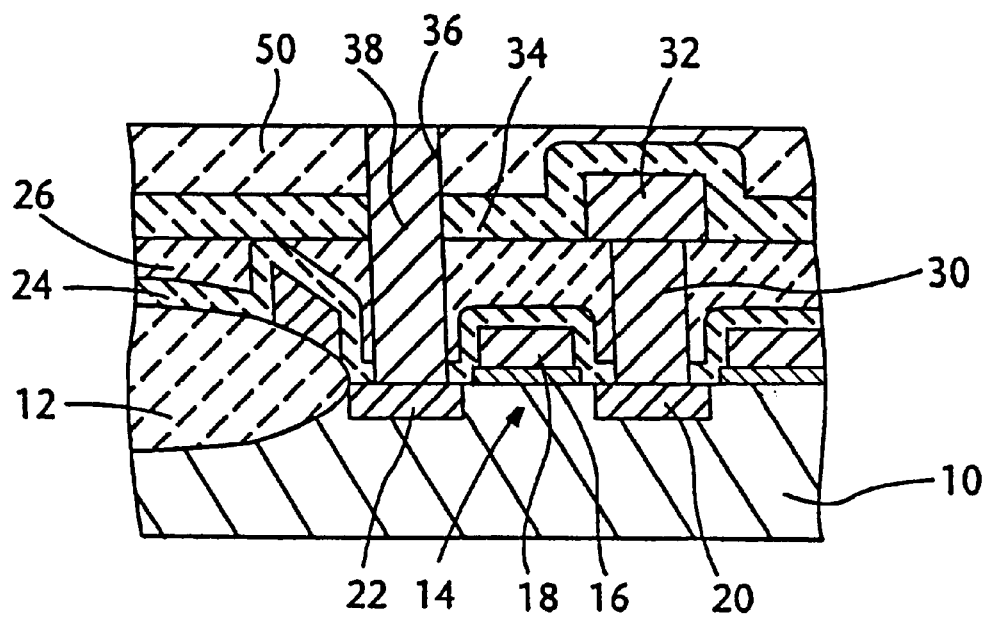

Referring to FIG. 2(C), a conductor film (38) is deposited on the planarizing film 50 until the contact hole 36 is completely filled with the deposited conductor 38. After that, the deposited conductor film is mostly removed by an etch-back treatment so as to leave the conductor 38 only in the contact hole 36. In the etch-back treatment it is inevitable that the planarizing film 50 also undergoes etching and consequently reduces thickness. However, when the initial thickness of the planarizing film 50 is appropriate, the underlying insulating film 34 remains undamaged.

Figure 2D:
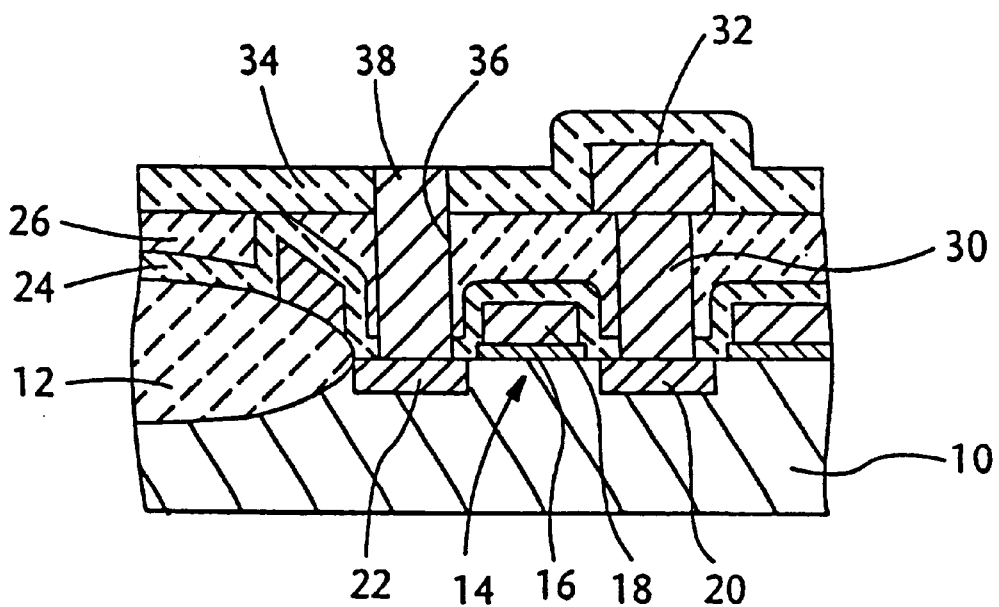

Next, as shown in FIG. 2(D), the planarizing film 50 is completely removed by etching so as not to etch the insulating film 34 and the conductor 38. In this etching process the selectivity to the planarizing film 50 relative to the underlying insulating film 34 should be sufficiently high. The insulating film 34 serves as an etch stop film.

Figure 2E:
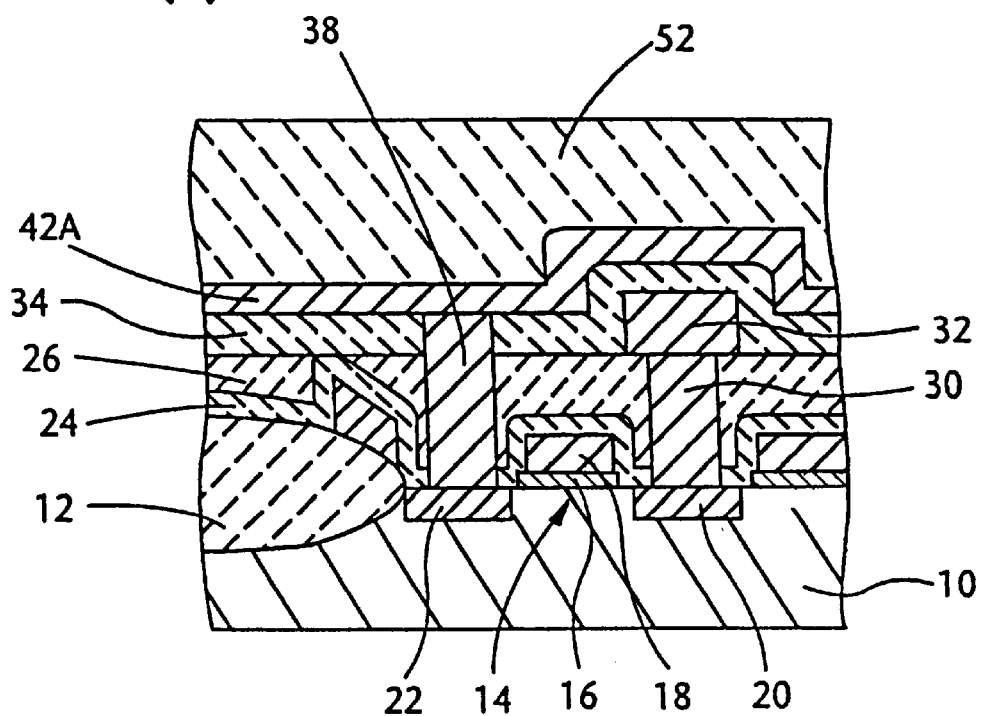

Next, as shown in FIG. 2(E), a conductor film 42A such as a polysilicon film is deposited on the insulating film 34. The conductor film 42A provides the bottom part of the aimed cylindrical storage node 42. Then, a relatively thick dielectric film 52 is deposited on the conductor film 42A. The thickness of the dielectric layer 52 is nearly equal to the height of the aimed cylindrical storage node 42. A BPSG film is suitable as the dielectric film 52. When the insulating film 34 is a silicon nitride film, it is also possible to employ a silicon oxide film as the dielectric film 52.

Figure 2F:
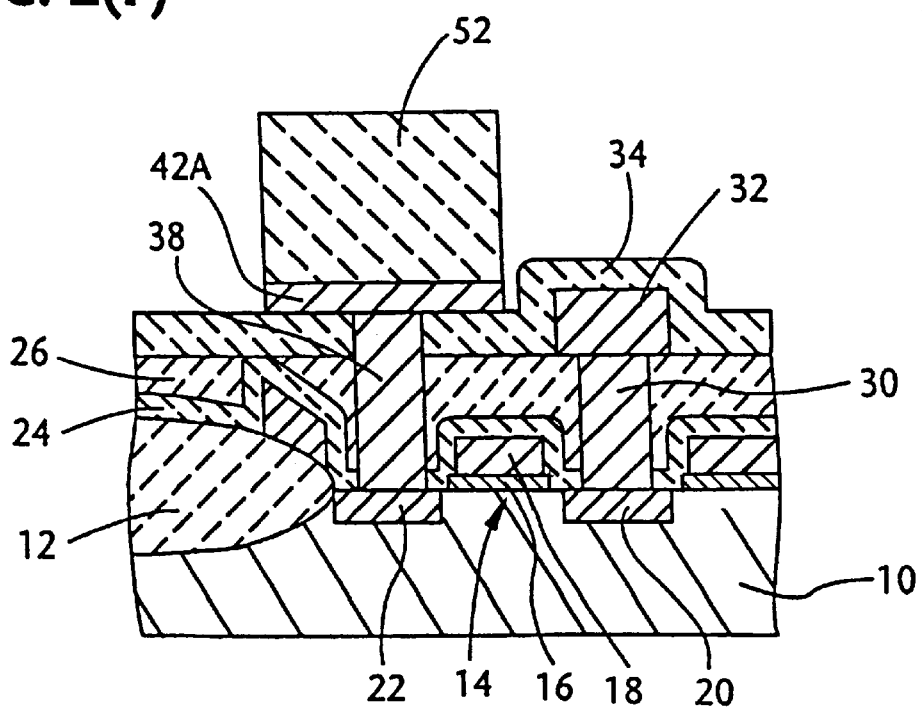

Referring to FIG. 2(F), the dielectric film 52 is patterned together with the underlying conductor film 42A, into the shape of a solid cylinder by photolithography and subsequent etching. In the etching process the insulating film 34 serves as an etch stop film. In view of desired etch selectivies, it is suitable that the planarizing film 50 in FIG.

2(B) and the dielectic film 52 in FIG. 2(E) are formed of the same material. If two different materials are used for these two films 50 and 52, the two materials should be nearly equivalent in etch rate relative to the etch rate of the etch stop film 34. The dielectric film 52 in the shape of a solid cylinder will be called a core.

Figure 2G:
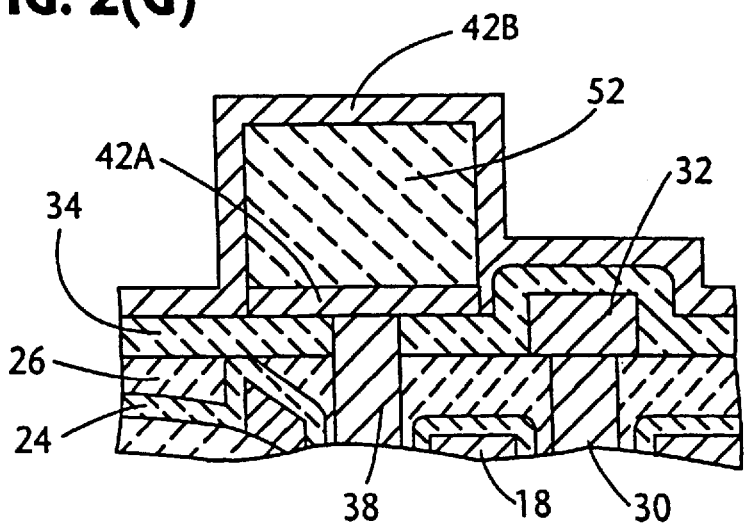

Referring to FIG. 2(G), a conductor film 42B such as a polysilicon film is deposited on the insulating film 34 so as to entirely cover the dielectric core 52 and the underlying conductor film 42A.

Figure 2H:
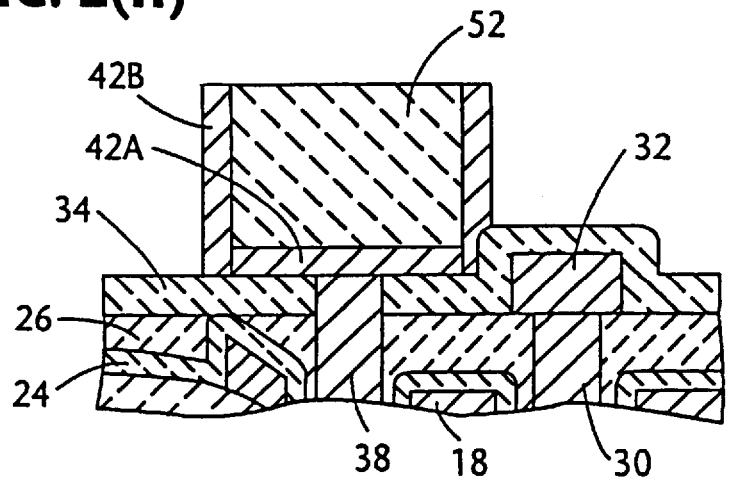

Referring to FIG. 2(H) the conductor film 42B is subjected to etch-back by anisotropic etchings usually by reactive ion etching (RIE), so as to leave the conductor film 42B only as a cylindrical sidewall on the cylindrical side face of the dielectric core 52 and the underlying conductor film 42A.

Figure 2I:
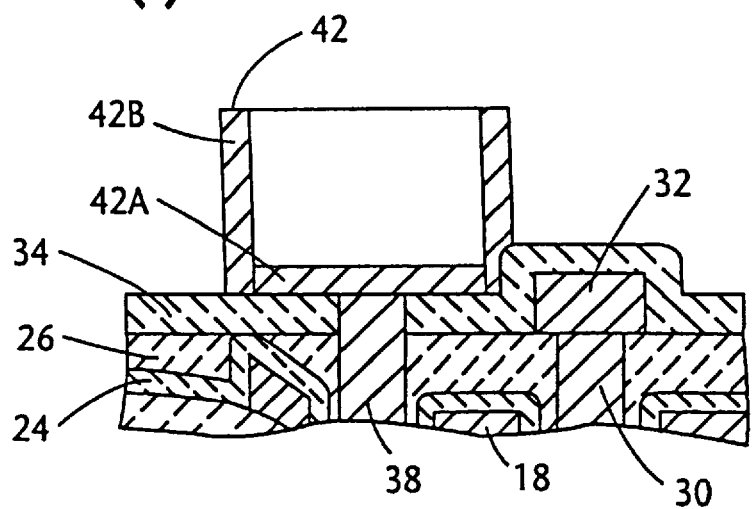

After that, as shown in FIG. 2(I), the dielectric core 52 is completely removed by selective etching. In this etching process it is necessary that the selectively to the dielectric core 52 relative to the insulating film 34 should be sufficiently high. For example, when the dielectric core 52 is formed of BPSG, an aqueous solution of hydrofluorice acid or a vapor of the acid solution can be used as the etchant. In the selective etching process, the insulating film 34 serves as an etch stop film. The insulating film 34 still maintains a sufficient thickness because at the stage of forming the capacitor contact 38 the film 34 was protected by the planarizing film 50. Therefore, the insulating films 34, 26 and 24 are never damaged by penetration of the etchant used to remove the dielectric core 52. The conductor film 42A lying on the insulating film 34 and the cylindrical sidewall part of the conductor film 42B constitute the cylindrical storage node 42 shown in FIG. 1.

As another embodiment of the invention, FIGS. 3(A) to 3(E) illustrate a modification of the process steps illustrated in FIGS. 2(E) to 2(I). The steps illustrated in FIGS. 2(A) to 2(D) are performed in the same manner.

Figure 3A:
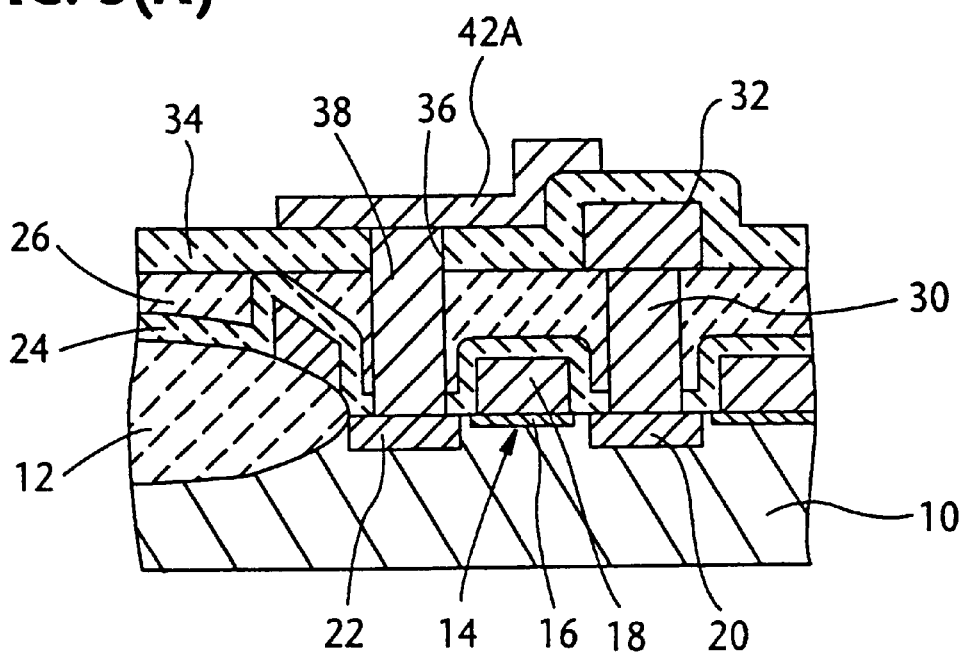
FIGS. 3(A) to 3(E) illustrate a modification of the process steps illustrated in FIGS. 2(E) to 2(I)

Referring to FIG. 3(A), a conductor film 42A such as a polysilicon film is deposited on the insulating film 34, and the film 42A is patterned into the shape of the bottom part of the aimed cylindrical storage node 42.

Figure 3B:
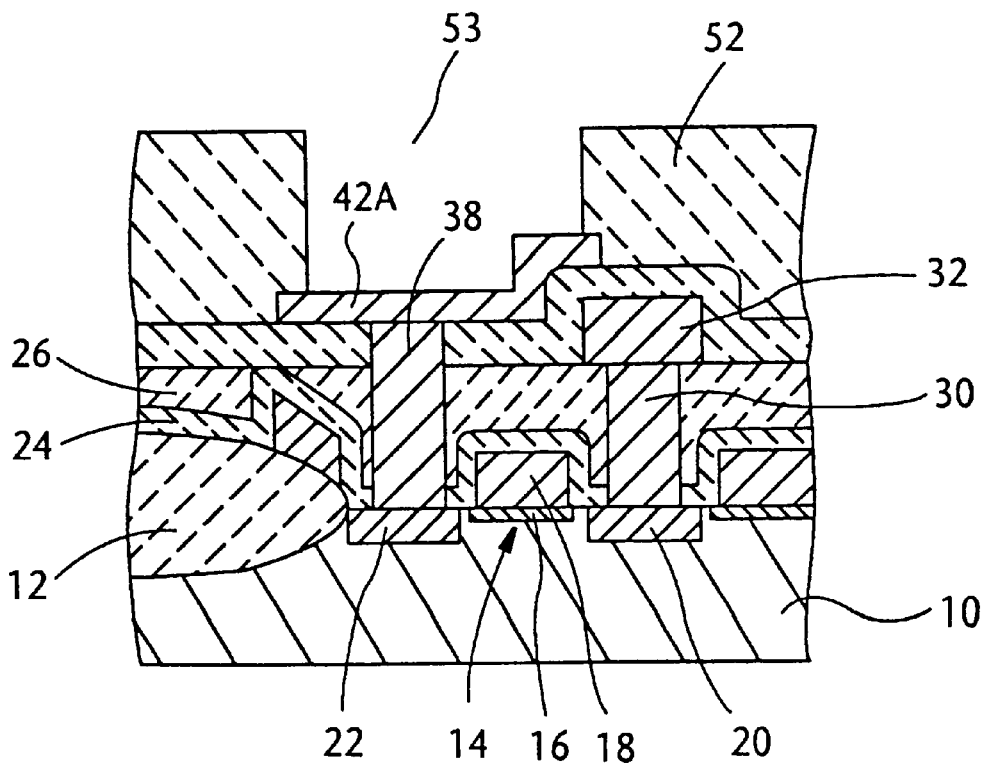

Referring to FIG. 3(B), a relatively thick dielectric film 52 such as a BPSG film is deposited on the insulating film 34, As a result, the patterned conductor film 42A is buried under the dielectric film 52. Then, above the patterned conductor film 42A, a cylindrical opening 53 is formed in the dielectric film 52. The diameter of the opening 53 is equal to the outer diameter of the cylindrical storage node to be formed.

Figure 3C:
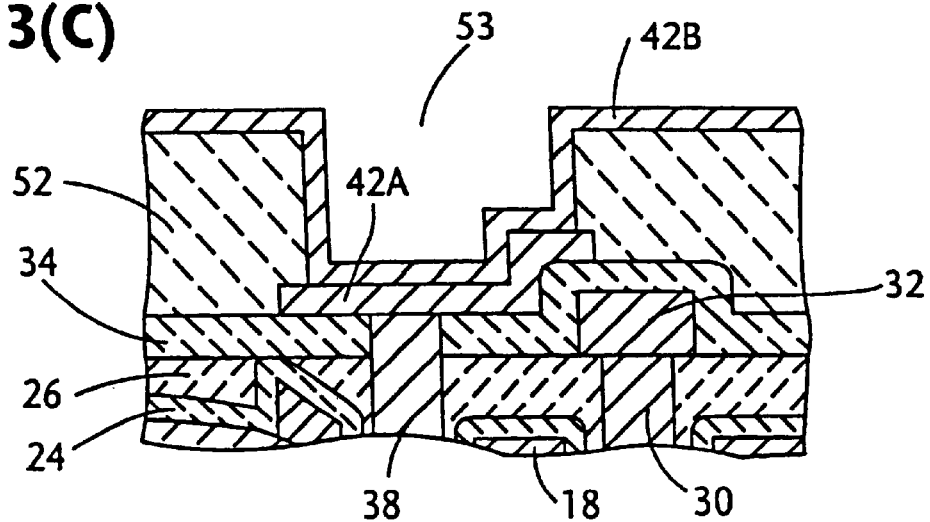

As shown in FIG. 3(C), a conductor film 42B such as a polysilicon film is deposited on the dielectric film 52. In the opening 53, the conductor film 42B deposits on the conductor film 42A and the cylindrical wall face of the dielectric film 52.

Figure 3D:
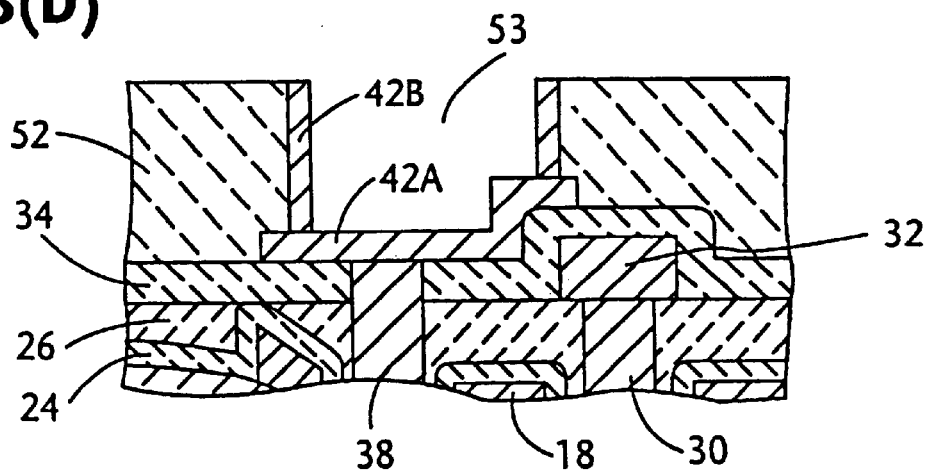

Referring to FIG. 3(D), the conductor film 42B is subjected to etch-back by anisotropic etching so as to leave the conductor film 42B only on the cylindrical wall face in the opening 53.

Figure 3E:
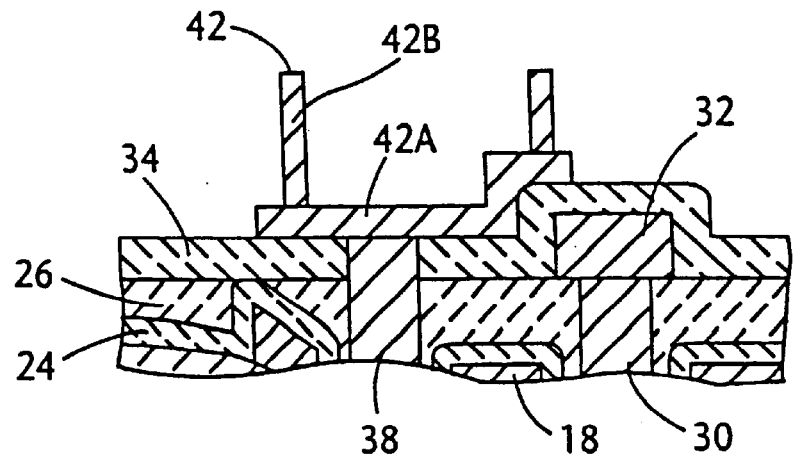
Figure 4:
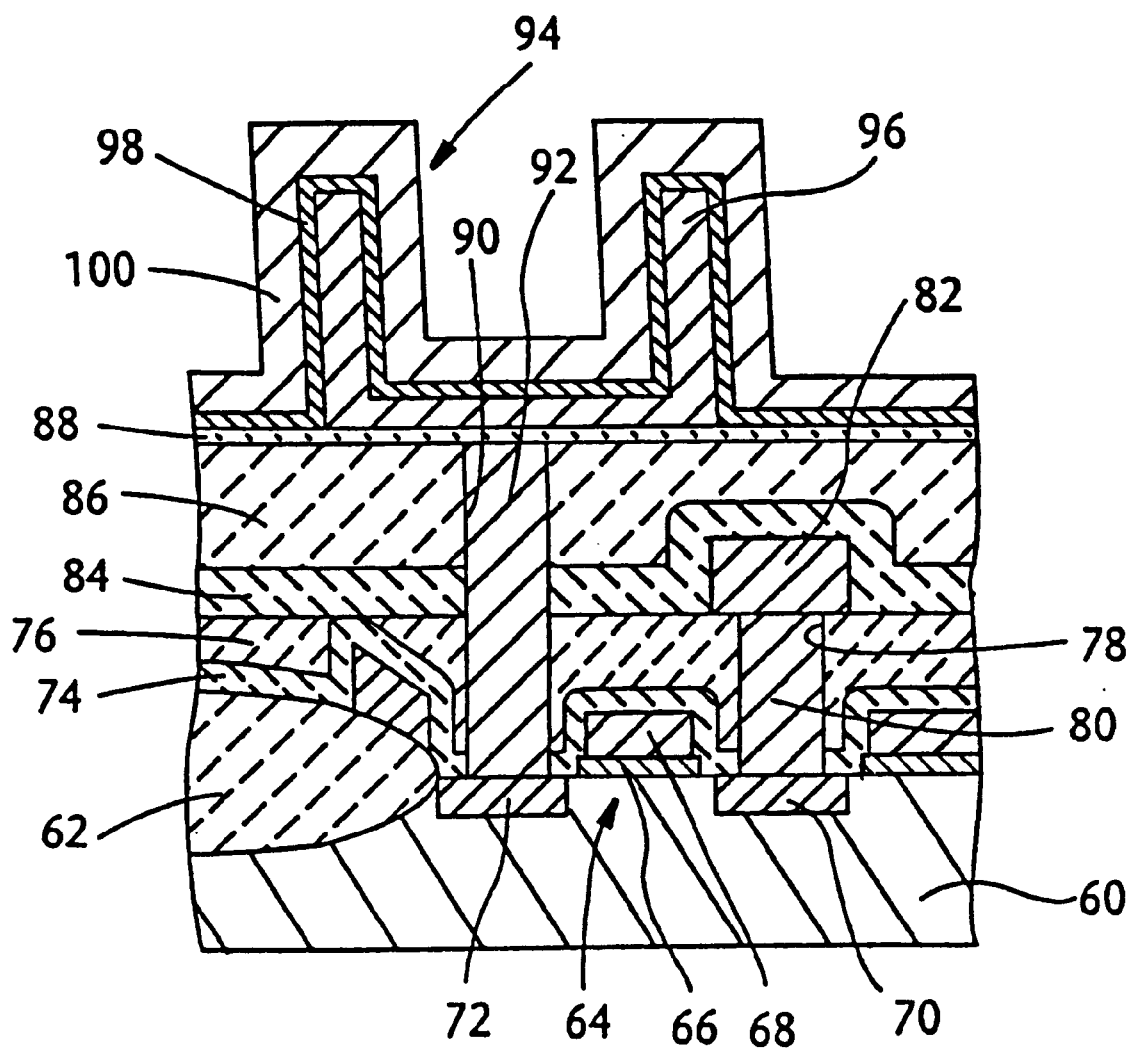
FIG. 4 is a schematic cross-sectional view of a memory cell having a cylindrical capacitor produced by a known method.
Figure 5A:
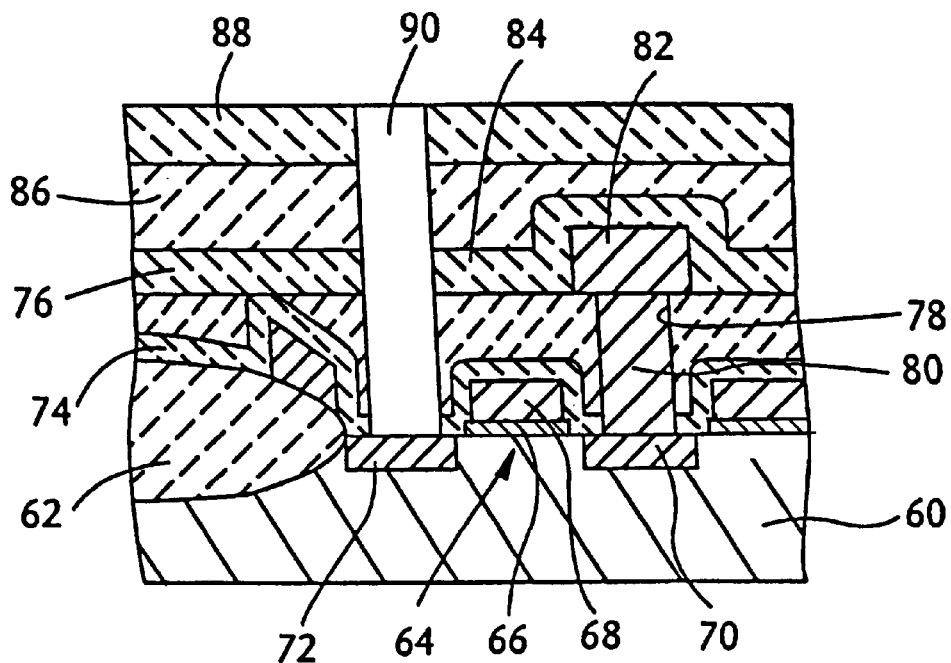
FIGS. 5(A) to 5(F) illustrates in schematic cross-sectional views, a known process of forming a cylindrical storage node in the memory cell of FIG. 4.
Figure 5B:
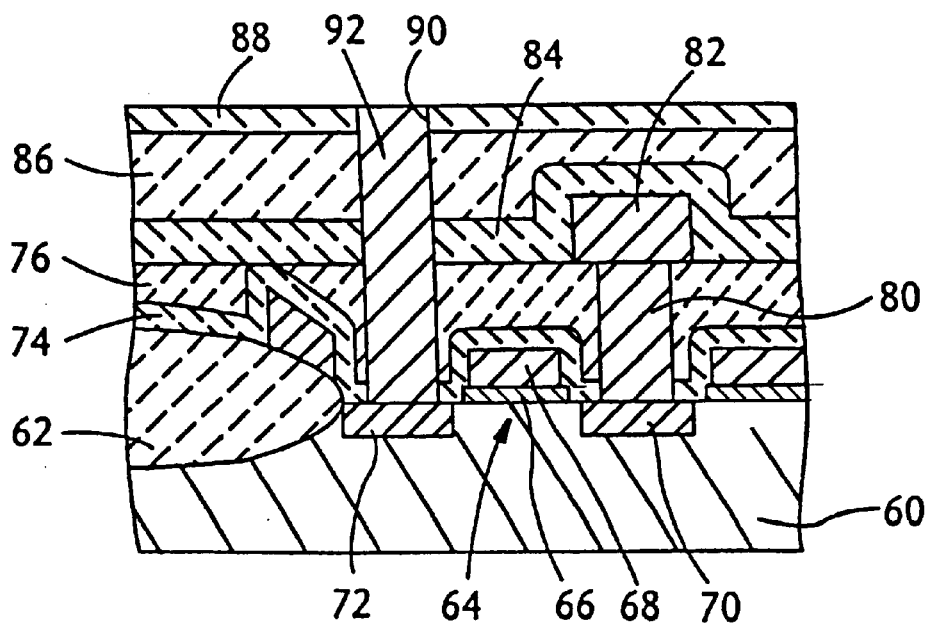
Figure 5C:
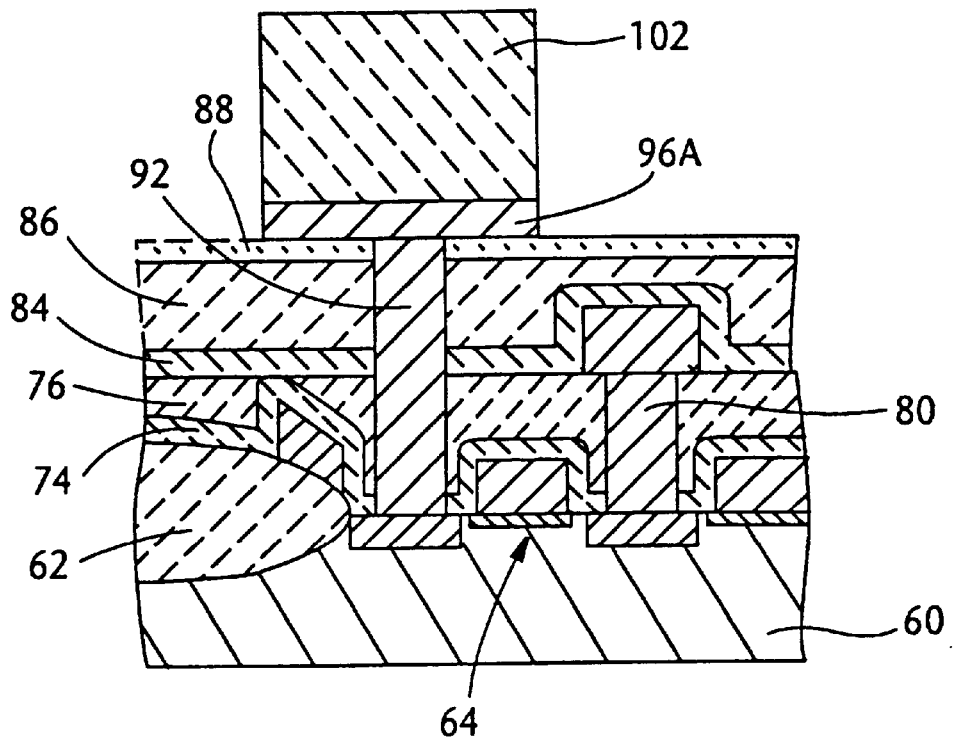
Figure 5D:
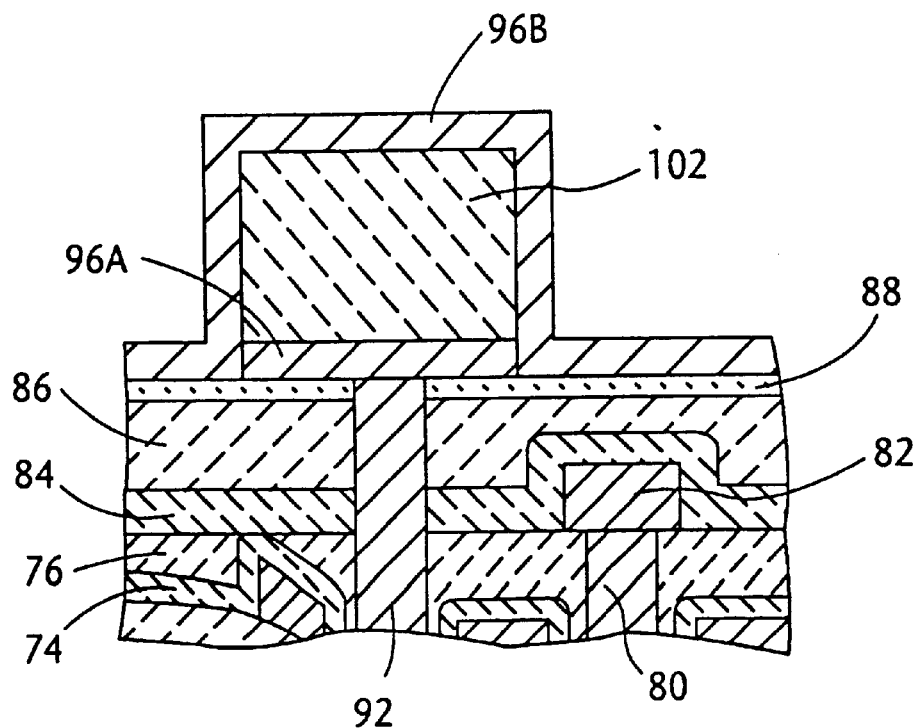
Figure 5E:
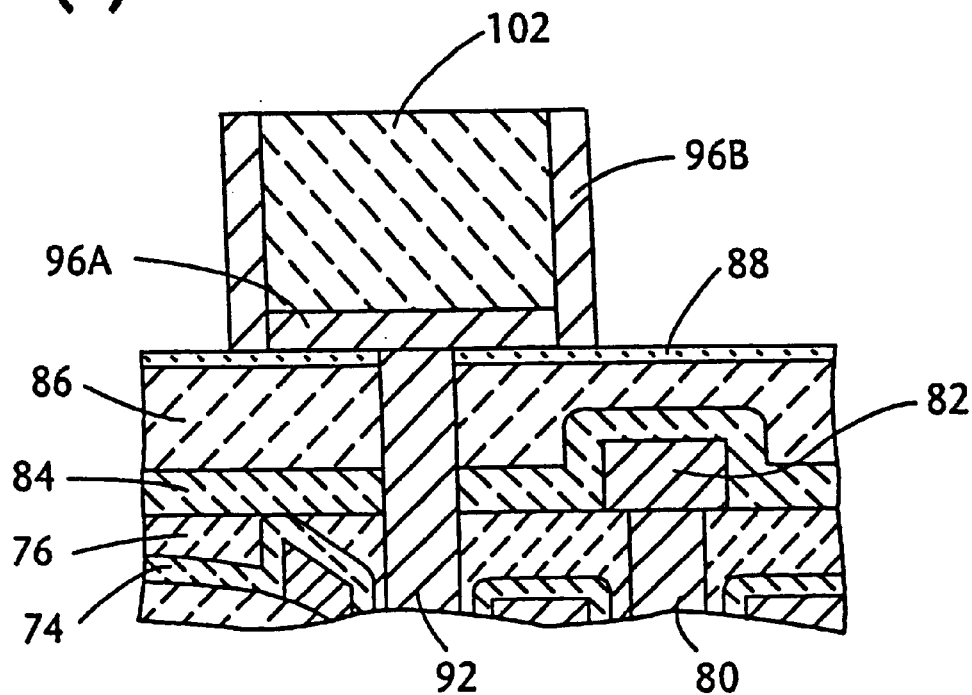
Figure 5F:
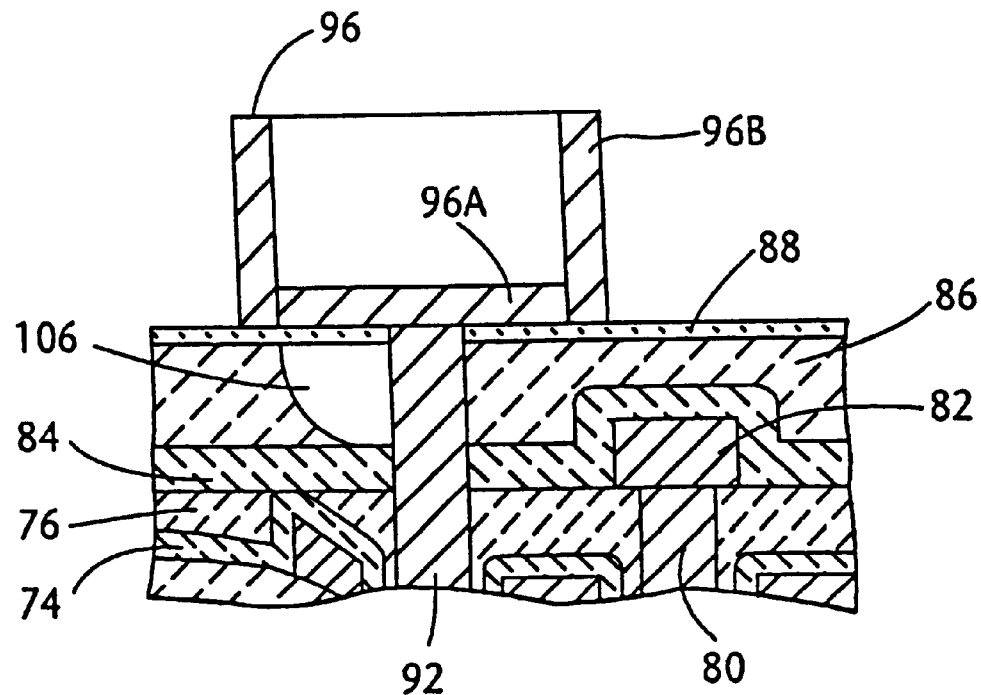

Next, as shown in FIG. 3(E), the dielectric film 52 is completely removed by selective etching. The insulating film 34 serves as an etch stop film. The conductor film 42A lying on the insulating film 34 and the cylindrically remaining part of the conductor film 42B constitute a cylindrical storage node 42.

What is claimed is:

1. A method of producing a cylindrical storage node of a capacitor in a semiconductor memory cell having a MOS transistor coupled with said capacitor, the method comprising the steps of:

(a) forming a first dielectric film, said first dielectric film serving as an etch stop film, on an interlayer insulator laid over a semiconductor substrate in which said transistor is already fabricated;

(b) forming a second dielectric film, said second dielectric film serving as a planarizing film, on said first dielectric film and planarizing the surface of the second dielectric film;

(c) forming a contact hole, said contact hole reaching one of source and drain region of said transistor, through said first and second dielectric films and said interlayer insulator and filling the contact hole with a conductor to provide a storage node contact;

(d) removing said second dielectric film by etching to expose said first dielectric film after forming the storage node contact of step c;

(e) depositing a first conductor film on said first dielectric film, the first conductor film being in contact with said storage node contact;

(f) depositing third dielectric film over said first conductor film and patterning the third dielectric film so as to provide a cylindrical wall face on said first conductor film, wherein said third dielectric film is substantially thicker than other dielectric films;

(g) forming a second conductor film as a cylindrical sidewall on said cylindrical wall face of said third dielectric film; and (h) completely removing said third dielectric film by etching.

2. A method according to claim 1, wherein said second dielectric film and said third dielectric film are of the same material.

3. A method according to claim 1, wherein said second dielectric film and said third dielectric film are nearly equivalent in etch rate relative to the etch rate of said first dielectric film.

4. A method according to claim 1, wherein said first dielectric film is a silicon nitride film.

5. A method according to claim 4, wherein said second dielectric film is a borophosphosilicate glass (BPSG) film.

6. A method according to claim 5, wherein said third dielectric film is a BPSG film.

7. A method according to claim 5, wherein said third dielectric film is a silicon oxide film.

8. A method according to claim 1, wherein said first dielectric film is a silicon oxide film.

9. A method according to claim 8, wherein both said second dielectric film and said third dielectric film are BPSG films.

10. A method according to claim 1, wherein in step (f) said third dielectric film and said first conductor film are patterned such that the third dielectric film and the first conductor film together form a solid cylinder.

11. A method according to claim 1, wherein step (f) comprises the sub-steps of (i) patterning said first conductor film into the shape of a bottom part of the cylindrical storage node, (ii) depositing said third dielectric film over said first dielectric film and the patterned first conductor film and (iii) forming a cylindrical hole in the third dielectric film above the patterned first conductor film.

* * * * *